United States Patent
Yang

(10) Patent No.: US 8,732,543 B1
(45) Date of Patent: May 20, 2014

(54) TENSOR PRODUCT CODES FOR FLASH

(75) Inventor: Xueshi Yang, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 302 days.

(21) Appl. No.: 13/184,949

(22) Filed: Jul. 18, 2011

Related U.S. Application Data

(60) Provisional application No. 61/371,100, filed on Aug. 5, 2010.

(51) Int. Cl.
*H03M 13/00* (2006.01)
(52) U.S. Cl.
USPC ............................ 714/755; 714/777; 714/782
(58) Field of Classification Search
USPC .......... 714/746, 755, 758, 763, 777, 778, 782
See application file for complete search history.

(56) References Cited

U.S. PATENT DOCUMENTS

| | | | |
|---|---|---|---|
| 7,861,131 B1 | 12/2010 | Xu et al. | |
| 2003/0058958 A1* | 3/2003 | Shokrollahi et al. | 375/295 |
| 2009/0024905 A1* | 1/2009 | Shalvi et al. | 714/773 |
| 2010/0125764 A1* | 5/2010 | Kose | 714/704 |
| 2010/0199149 A1* | 8/2010 | Weingarten et al. | 714/773 |
| 2011/0258510 A1* | 10/2011 | Watson et al. | 714/752 |

OTHER PUBLICATIONS

Fahrner, A.; Fecker, U.; Klarer, R.; Grieber, H., "On GEL codes for partial response channels," Communications, 2004 IEEE International Conference on , vol. 1, No., pp. 533,537 vol. 1, Jun. 20-24, 2004.*

* cited by examiner

*Primary Examiner* — Cynthia Britt

(57) ABSTRACT

In embodiments, data may be encoded based on a tensor product code by encoding incoming data to produce first codewords, and encoding the first codewords to produce second codewords. The incoming data may be combined with the second codewords to produce messages, which can then be transmitted and/or stored. Decoding a received message may include encoding a data portion to produce an intermediate code, and decoding the intermediate code using a codeword portion of the message to produce a corrected codeword. The data portion may then be decoded using the corrected codeword to recover data from the message.

24 Claims, 14 Drawing Sheets

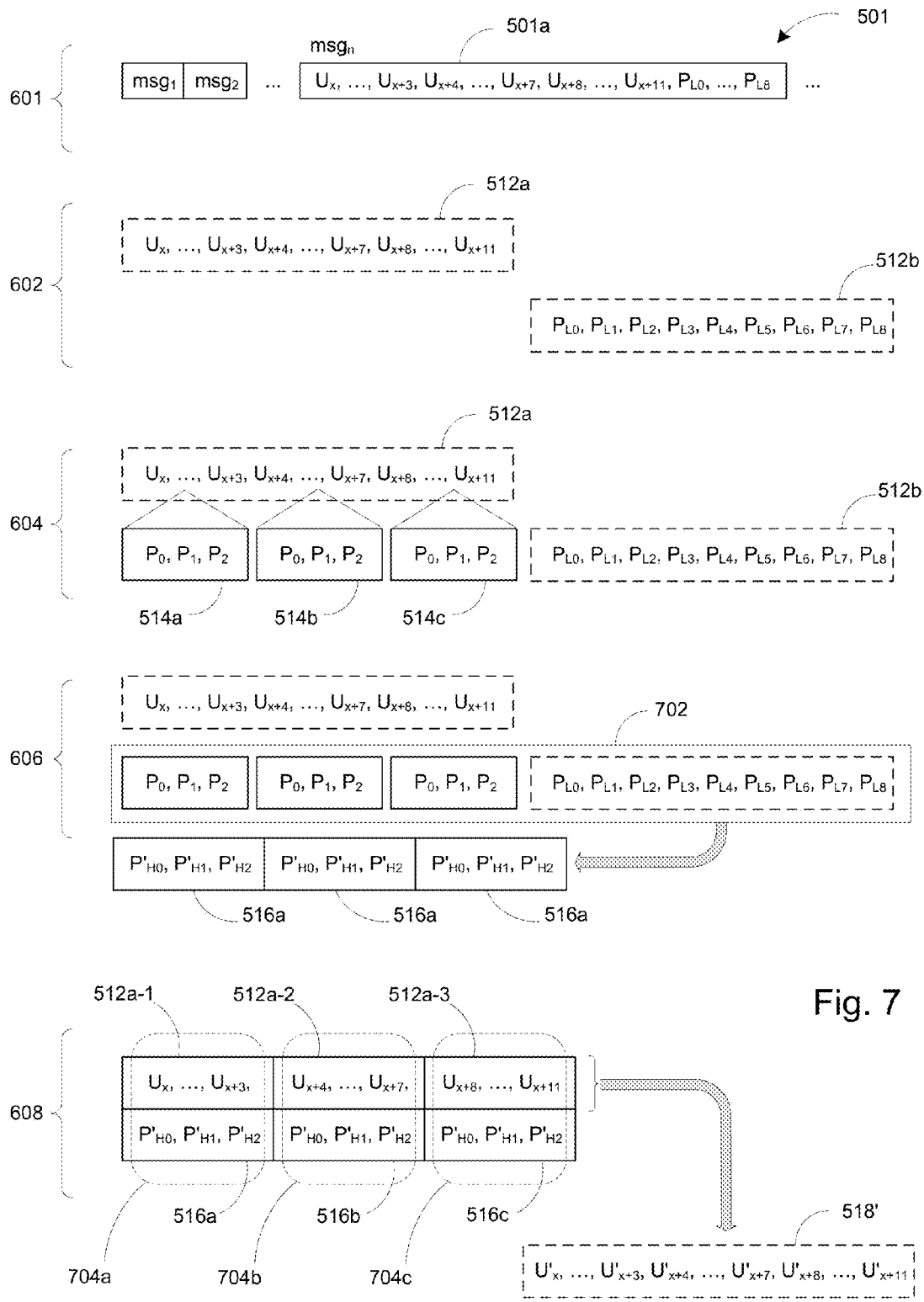

TENSOR PRODUCT CODES FOR FLASH

CROSS REFERENCE TO RELATED APPLICATIONS

The present disclosure claims priority to U.S. Provisional App. No. 61/371,100 filed Aug. 5, 2010, the content of which is incorporated herein by reference in its entirety for all purposes.

The present disclosure is related to U.S. Pat. No. 7,861,131 issued Dec. 28, 2010, the content of which is incorporated herein by reference in its entirety for all purposes.

BACKGROUND

The present invention relates to processing data in data communication systems and data storage systems, and in particular to encoding and decoding of data for purposes of error correction.

Unless otherwise indicated herein, the approaches described in this section are not prior art to the claims in this application and are not admitted to be prior art by inclusion in this section.

Error correction is an important aspect of providing reliable data delivery in data communication systems and reliable data storage and access in data storage systems. An error correction technique that is commonly employed is called Low Density Parity Check (LDPC). LDPC is a linear block coding technique that can provide performance close to the theoretical maximum of the communication channel, using an iterated soft-decision decoding approach.

The increasing use of mobile devices presents challenges in error detection and error correction. For example, the compact dimensions of mobile devices typically impose a small footprint requirement for its electronic circuits. Mobile devices are becoming increasingly more like personal computers, requiring large storage capacity and high speed operation in a highly mobile configuration. Accordingly, high capacity, high speed flash memory is a common design element in mobile devices, and LDPC would be a suitable error correction technique.

However, high speed decoders that employ LDPC are typically characterized by high complexity (i.e., high gate count for implementing the logic, and consequently large silicon area) and high power consumption requirements, which conflict with the constraints of mobile devices. In addition, a flash memory device typically employs "hard decision" block codes, which means that for every input and output a hard decision is made whether it corresponds to a one or a zero bit. Soft data (e.g., reliability information) that is required with "soft decision" techniques such as LDPC may not be available in a particular flash memory design.

SUMMARY

In some embodiments, a method of recovering data may include receiving a message having a data part and a code part. A generated code may be produced based on the data part. The generated code and the code part from the received message may be used in a decoding action to produce a recovered code. Recovered data may be produced by performing another decoding action using the data part from the received message and the recovered code. The method may be performed in a flash memory.

In some embodiments, the generated code and the code part may be treated as a codeword for the decoding action.

The data part and the recovered code may be treated as a codeword for the decoding action.

The method may further include decoding the recovered data to produce user data contained in the recovered data.

One or more iterations can be performed using the recovered data produced by the second decoding action.

In some embodiments, a system may include a separator unit that receives a message and outputs a data part and a code part that are contained the received message. A generator may receive the data part to produce a generated code. A first decoder may receive the generated code and the code part to produce a recovered code. A second decoder may receive the data part and the recovered code to produce recovered data.

In embodiments, the first decoder may decode a codeword comprising the intermediate code and the code part of the received message. In embodiments, the second decoder may decode a codeword comprising the data part of the received message and the recovered code.

In an embodiment, a flash memory device includes a multi-stage encoder, a memory, and a multi-stage decoder. The multi-stage encoder may include a first coder to produce a first code from incoming data, and a second coder to produce a second code from the first code. The multi-stage encoder may include a combiner that produces encoded data for storage in the memory comprising the incoming data and the second code. The multi-stage decoder may include a generator to produce a third code. A first decoder produces a recovered code using the third code and the second code in the encoded data. A second decoder produces recovered data using the recovered code.

The following detailed description and accompanying drawings provide a better understanding of the nature and advantages of the present invention.

BRIEF DESCRIPTION OF THE DRAWINGS

FIGS. 7, 7A, 7B represent data diagrams of a decoding process in accordance with disclosed embodiments.

DETAILED DESCRIPTION

Described herein are systems and methods for error correction of data. As will become apparent from the disclosure, embodiments may be generally recognized as relating to the category of tensor product coding techniques.

In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include modifications and equivalents of the features and concepts described herein.

As used herein, the term "channel" will be understood to refer a medium on which a data-bearing signal is communicated and/or stored. Because various aspects of a channel may corrupt data that is communicated or stored, the data recovered subsequent to communication or storage may be different from their intended values; such differences are referred to herein as "errors."

The term "encoding" will be understood as generally referring to the process of generating redundant data (e.g., parity information) to facilitate subsequent detection and/or correction of errors in the data, and "decoding" as referring to the inverse process of detecting and/or correcting the errors using the redundant data. The terms "error correction code" and "code" will be understood to refer to the redundant data that may be generated by applying a suitable algorithmic process on incoming data. A code may be generated by encoding the incoming data. A code may be generated by computing parity bits from the incoming data, and so on. The term "codeword" will be understood to be a (N+K)-bit datum comprising N information bits and a K-bit code, where the code may be computed from the information bits. The code may be used to detect errors in the information bits of a received codeword. Depending on how the redundancy bits were computed, detected errors may be corrected to recover the original information bits. The decoding process may receive a codeword, and decode the information bits in the codeword using the code portion of the codeword to detect and/or correct errors introduced by the channel.

Figure 1:
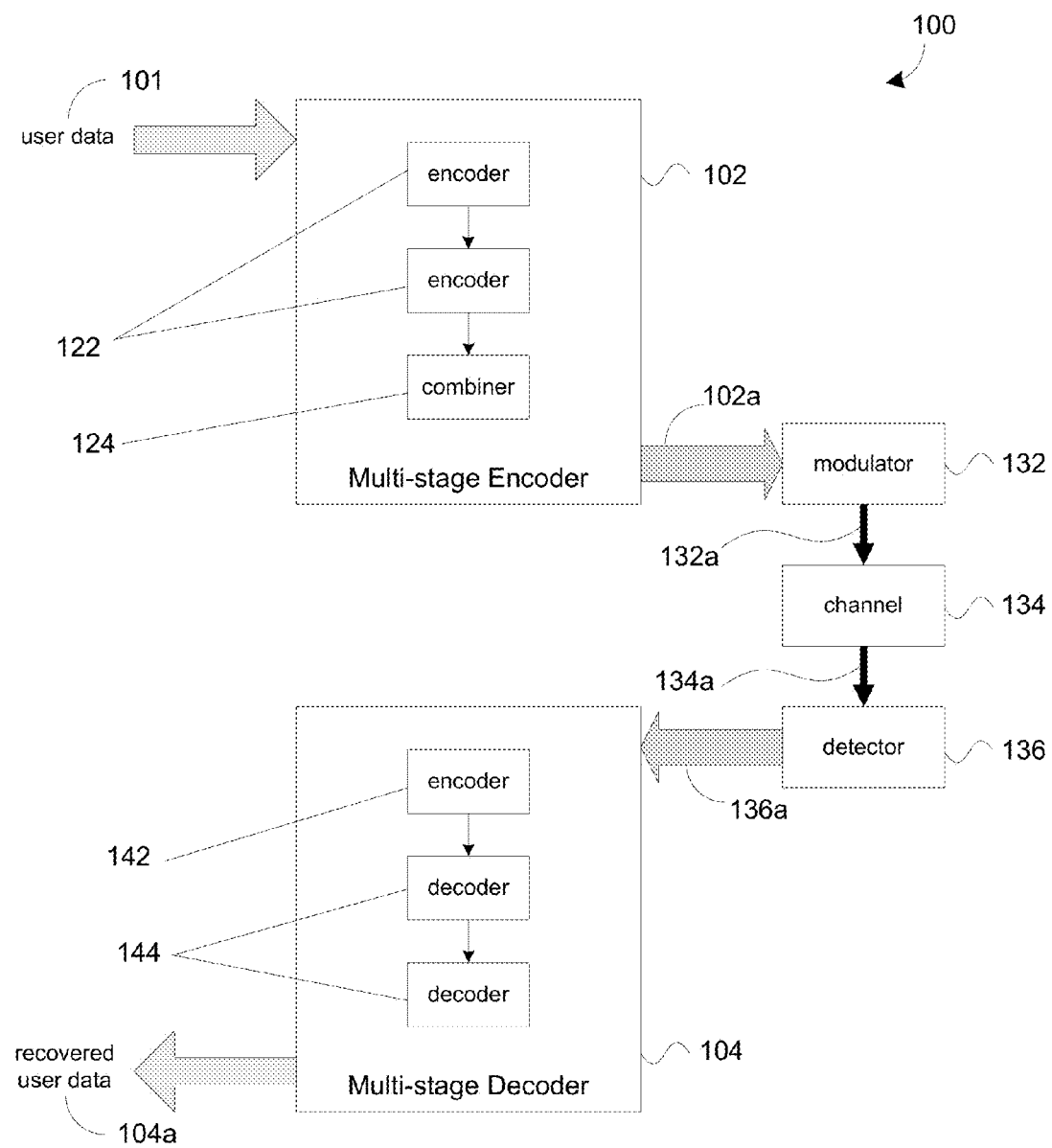
FIG. 1 shows a block diagram of an embodiment of the present invention.

In some embodiments, a system 100, such as illustrated by the block diagram in FIG. 1, may receive a user data stream 101 (i.e., a stream of 1's and 0's) that is encoded by a multi-stage encoder 102 to produce a message stream 102a of encoded data. The multi-stage encoder 102 may include multiple encoding stages 122 and a combiner 124. Additional details of the multi-stage encoder 102 will be discussed below.

The message stream 102a feeds into a modulator 132 which generates a signal 132a representative of the message stream. The signal 132a may be modulated accordingly and communicated via a channel 134. The particular form of modulation will depend on the nature of the channel.

Channel 134 represents a medium on which the signal 132a is transmitted and/or stored. In some embodiments, channel 134 may represent a storage medium, such as a magnetic storage medium (e.g., a hard drive), an optical storage medium (e.g., a Compact Disc, CD), or an electrical storage medium (e.g., random access memory, flash memory), and so on. The channel 134 may correspond to a read path of a disk drive, including a magnetic storage medium, disk-drive read head, and other devices. In other embodiments, channel 134 may be a signal-bearing communication channel; e.g., a transmitted radio wave.

As explained above, the channel 134 may corrupt the signal 132a thereby introducing errors into the signal. The source of data corruption, sometimes referred to as "noise," may include interference sources that may be external and/or internal to the channel 134. For example, the source of data corruption may include other interfering communications signals, or physical corruption to a magnetic storage medium or read devices associated with the channel. The source of data corruption may be variations in the read out voltage levels when reading data from a semiconductor storage element. Accordingly, a signal 134a produced by the channel 134 (e.g., received radio wave, data read out, etc.) may be a corrupted version of the incoming signal 132a. A detector 136 in communication with the channel 134 may receive the signal 134a and demodulate the signal to produce detected data 136a. The detector 136 may employ hard decision detection techniques to produce hard decision data or soft decision detection techniques to incorporate soft information (e.g., Log-Likelihood Ratio, LLR, data) with the detected data.

The detected data 136a may be received by a multi-stage decoder 104 to produce recovered user data 104a. In some embodiments, the multi-stage decoder 104 may include an encoding stage 142 and multiple decoding stages 144. Additional details of the encoder 104 will be discussed below.

The user data stream 101 may originate from an application that is communicated and/or stored and then recovered at another time and/or place. The user data stream 101 may be data from a data processor being written to memory, and so on. The user data stream 101 may be provided in the form of a stream of binary digits, or bits (i.e., a stream of 1's and 0's).

The system 100 may be a semiconductor memory. The user data 101 and recovered user data 104a may be data appearing on the data lines of the semiconductor memory. The multi-stage encoder 102 and modulator 132 may be part of the data writing circuitry of the semiconductor memory. The multi-stage decoder 104 detector may be part of the data read circuitry of the of the semiconductor memory. The storage elements of the semiconductor memory may constitute the channel 134. Data stored in the storage elements of the semiconductor memory may be read out of the semiconductor memory as analog voltage levels. The value ("1" or "0") of a data bit depends on the voltage level being above or below a threshold value. As such, variations in the voltage levels may manifest themselves as errors in the data. An example of semiconductor memory is flash memory based on NAND gate or NOR gate storage elements.

The system 100 may be a disk storage system. The multi-stage encoder 102 and modulator 132 may be part of the data writing elements of the disk storage system. The multi-stage decoder 104 detector may be part of the data read elements of the disk-based storage system. The storage medium (e.g., magnetic storage media, optical storage media, etc.) may constitute the channel 134. Errors in the stored data may arise as a result of defects on the storage medium.

The system 100 may be embodied in data communication system in which a data signal is transmitted from a transmitter-side of the data communication system to a receiver-side of the data communication system. The multi-stage encoder 102 and modulator 132 may be part of the transmitter-side. The multi-stage decoder 104 detector may be part of the receiver-side. The channel 134 may be radio waves (in the case of an electromagnetic transmission) or a cable (e.g., Ethernet cable, optical cable), and so on. Errors in the stored data may arise as a result of noise introduced during transmission of the data signal; for example, free-space path loss, inadequately shielded cabling, and so on.

Figure 2:
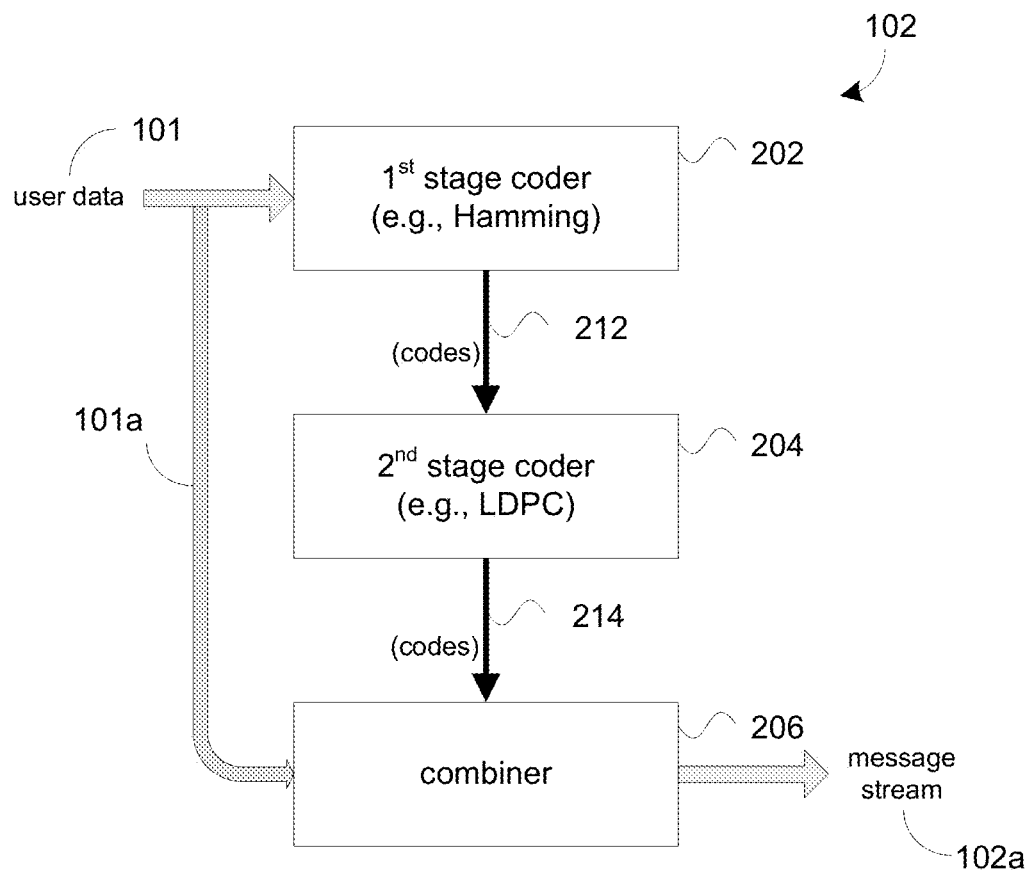
FIGS. 2 and 2A illustrate an encoder according to disclosed embodiments.

FIG. 2 represents a general structure of embodiments of the multi-stage encoder 102. A first stage coder 202 receives the user data stream 101 as incoming data and produces a first code stream 212. The first stage coder 202 may produce inner codewords, where each inner codeword comprises a segment of the incoming data (i.e., the user data stream 101) as the information bits and a code. The code portions of the inner codewords, accordingly, constitute the first code stream 212.

In a particular embodiment, for example, the first stage coder 202 may be a Hamming coder and the first code stream 212 would comprise the parity codes produced in accordance with Hamming coding. For instance, a common Hamming code is the (7, 4) code in which each codeword comprises: four bits in the user data stream 101; and three parity bits (a 3-bit code). In some embodiments, a first stage coder 202 that implements a (7, 4) Hamming code produces a stream of 3-bit codes as the first code stream 212.

Hamming codes fall into the category of linear block codes. It will be appreciated that any of a number of suitable linear block coders may be used as for the first stage coder 202. The first stage coder 202 may be a BCH coder, for example. In other embodiments, the first stage coder 202 may be generate parity codes using a Turbo Product Code based on Single Parity Codes (TPC/SPC).

A second stage coder 204 receives the code stream 212 as incoming data and produces a second code stream 214. The second stage coder 204 may produce outer codewords, where each outer codeword comprises a segment of the code stream 212 as the information bits and a code used to detect and/or facilitate correction of errors in the information bits. Accordingly, the codes from these outer codewords constitute the second code stream 214.

In a particular embodiment, the second stage coder 204 implements an LDPC coder. For example, the LDPC coder may produce (18, 9) outer codewords, where each outer codeword is 18 bits in total length of which nine bits are LDPC parity bits. The code stream 214 of an LDPC coder would comprise a stream of the 9-bit parity codes. It will be appreciated that other iterative coding techniques may be used for the second stage coder 204 such as turbo codes.

Continuing with FIG. 2, a combiner 206 receives each code in the second code stream 214 and a corresponding portion 101a of the user data stream 101 to produce the message stream 102a. The operation of combiner 206 will be explained in more detail below. The message stream 102a may then be modulated by modulator 132 and communicated via channel 134. For instance, the message stream 102a may be data that is transmitted to a receiver, the message stream 102a may be data that is stored in a memory (e.g., flash memory), and so on.

Figure 3:
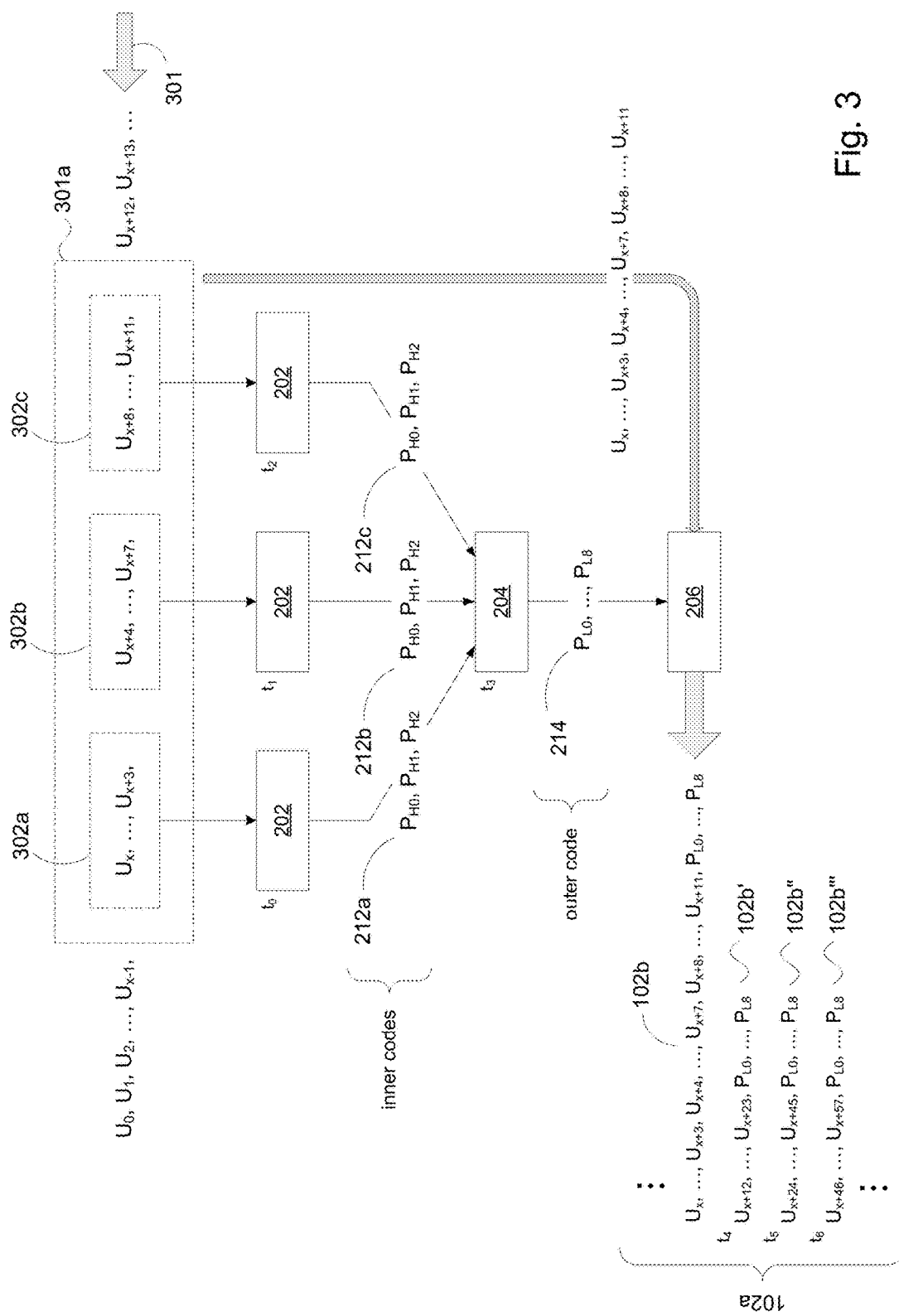
FIGS. 3, 3A, and 3B represent data diagrams of an encoding process in accordance with disclosed embodiments.
Figure 4:
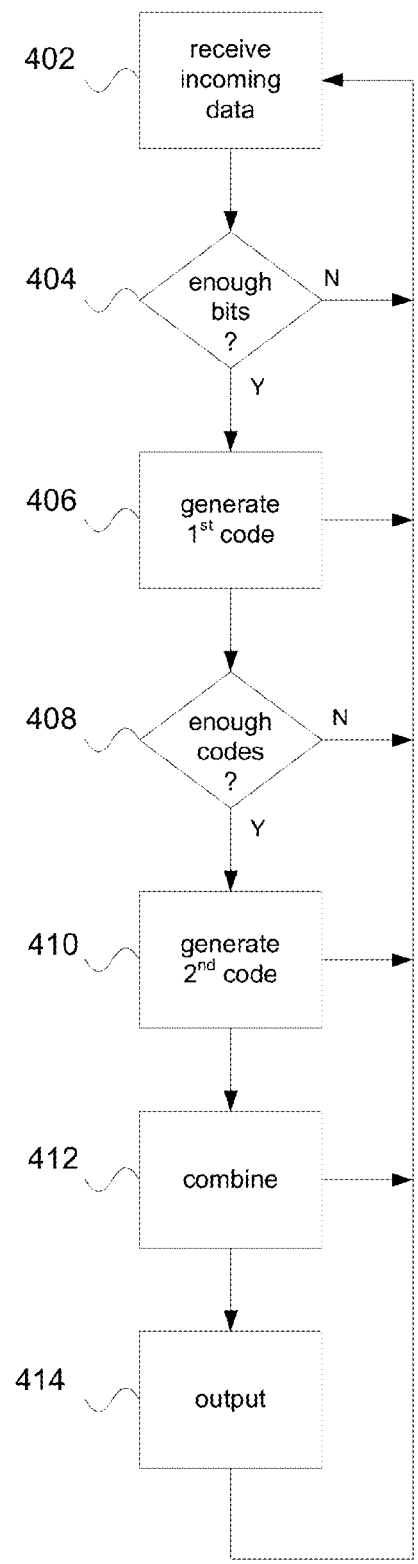
FIG. 4 is flow chart of an encoding process in accordance with disclosed embodiments.

Processing of data by the multi-stage encoder 102 shown in FIG. 2 in accordance with disclosed embodiments will now be discussed in connection with the data diagram shown in FIG. 3 and the flow chart shown in FIG. 4. The following configuration will be used as a running example for purposes of explanation: first stage coder 202 implements a (7, 4) Hamming code, and second stage coder 204 implements an (18, 9) LDPC code.

The flow chart in FIG. 4 will be explained in connection with FIGS. 2 and 3 for the production of one 9-bit LDPC code. Thus, at 402, incoming data 301 is received by the first stage coder 202. For example, the incoming data 301 may correspond to the user data stream 101. The incoming data 301 may be represented by data bits $U_0, U_1, U_2, \ldots$. FIG. 3 shows a portion 301a of the incoming data 301 comprising data segments 302a, 302b, 302c.

At 404, a determination is made whether enough data bits to constitute a data segment have been received by the first stage coder 202. In the running example, the first stage coder 202 is a (7, 4) Hamming coder which produces a 3-bit parity code ($P_{H0}, P_{H1}, P_{H2}$) for every four bits of the incoming data 301. Accordingly, operations 402 and 404 may be repeated until four bits have been read in. Thus, at time $t_0$ the coding process in the first stage coder 202 generates the following 7-bit codeword comprising data segment 302a and a corresponding 3-bit parity code:

$U_x, U_{x+1}, U_{x+2}, U_{x+3}, P_{H0}, P_{H1}, P_{H2}$.

At 406, the first stage coder 202 outputs the 3-bit Hamming code $P_{H0}, P_{H1}, P_{H2}$ to the second stage coder 204. Accordingly, at times $t_0$, $t_1$, and $t_2$ the Hamming coder 202 respectively produces "inner" parity codes 212a, 212b, and 212c from respective data segments 302a, 302b, 302c, which successively feed into the second stage coder 204.

At 408, a determination is made whether enough Hamming codes have been received by the second stage coder 204. In the running example, the second stage coder 204 is an (18, 9) LDPC coder which produces a 9-bit parity code ($P_{L0}, \ldots, P_{L8}$) for every 9 bits of incoming data (i.e., the Hamming codes). Accordingly, operations 402-408 may be repeated until three codes (total of 9 bits) have been received from the Hamming coder 202. Thus, at time $t_3$ the coding process in the second stage coder 204 generates the following 18-bit codeword:

$P_{H0}, P_{H1}, P_{H2}, P_{H0}, P_{H1}, P_{H2}, P_{H0}, P_{H1}, P_{H2}, P_{L0}, \ldots P_{L8}$, comprising three 3-bit Hamming codes as the information bits and a 9-bit LDPC "outer" parity code 214a. At 410 the second stage coder 204 outputs the outer code 214a to the combiner 206.

At 412, the combiner 206 receives the outer code 214a from second stage coder 204. The combiner 206 also receives the corresponding portion 301a of the incoming data 301. In accordance with principles of the present invention, the inner codes 212a, 212b, and 212c that were used to generate the outer code 214a are omitted from the message 102b. Accordingly, at 414, the combiner 206 outputs a message 102b comprising bits $U_x$-$U_{x+11}$ of the incoming data portion 301a and bits $P_{L0}$-$P_{L8}$ of the outer code 214a. For instance, the combiner 206 may be a multiplexer, alternating its output between data portion 301a and the outer code 214a to generate message 102b. Subsequent iterations produce, at times $t_4$, $t_5$, and $t_6$, additional messages 102b', 102b'', and 102b'''. The message stream 102a may comprise a sequence of messages 102b, 102b', 102b'', and 102b''', and so on. The foregoing may be summarized as follows:

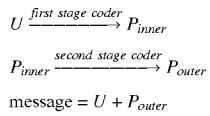

$$U \xrightarrow{\text{first stage coder}} P_{inner}$$

$$P_{inner} \xrightarrow{\text{second stage coder}} P_{outer}$$

$$\text{message} = U + P_{outer}$$

Figure 2A:
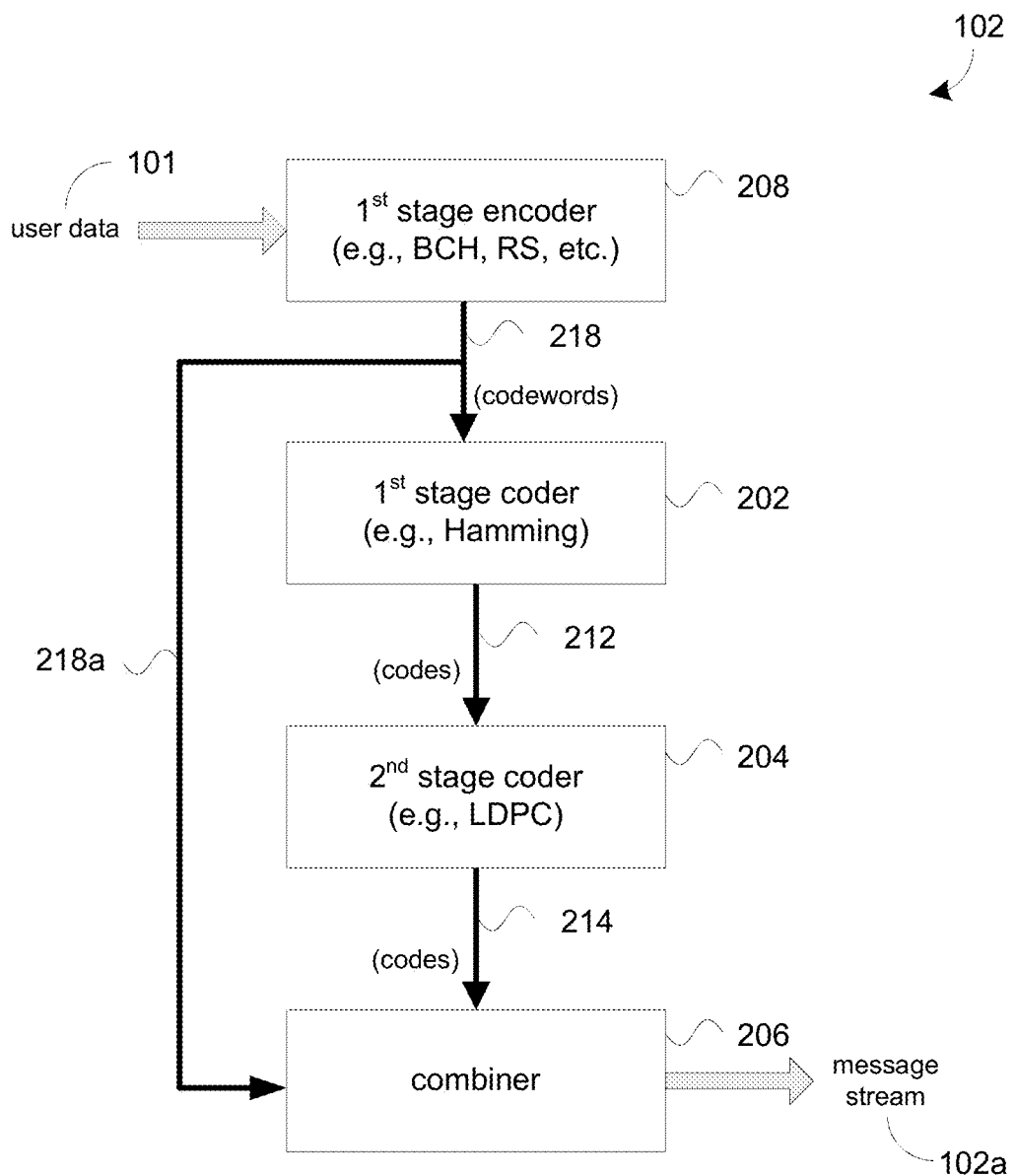

As shown in FIG. 2, the user data stream 101 is fed into the first stage encoder 202. In alternative embodiments, the user data stream 101 may be initially encoded prior to encoding by the first stage coder 202. FIG. 2A, for example, shows the user data stream 101 may be initially encoded with a first stage encoder 208 such as a Bose-Chadhuri-Hocquenghem (BCH) coder, a Reed-Solomon coder, and so on to produce a stream of codewords 218. The codeword stream 218 may then feed into the first stage coder 202 as incoming data, where the first code stream 212 is based on encoding of the codeword stream 218. Processing proceeds through the second stage encoder 204 as explained above. For instance, the combiner 206 receives the second code stream 214 and a corresponding portion 218a of the codeword stream 218 that was used to produce second code stream 214. The portion of codewords 218a may be combined with the second code stream 214 by the combiner 206 to produce the message stream 102a. With respect to the data diagram in FIG. 3, the codeword stream 218 of FIG. 2A would constitute the incoming data 301 in FIG. 3.

Figure 5:
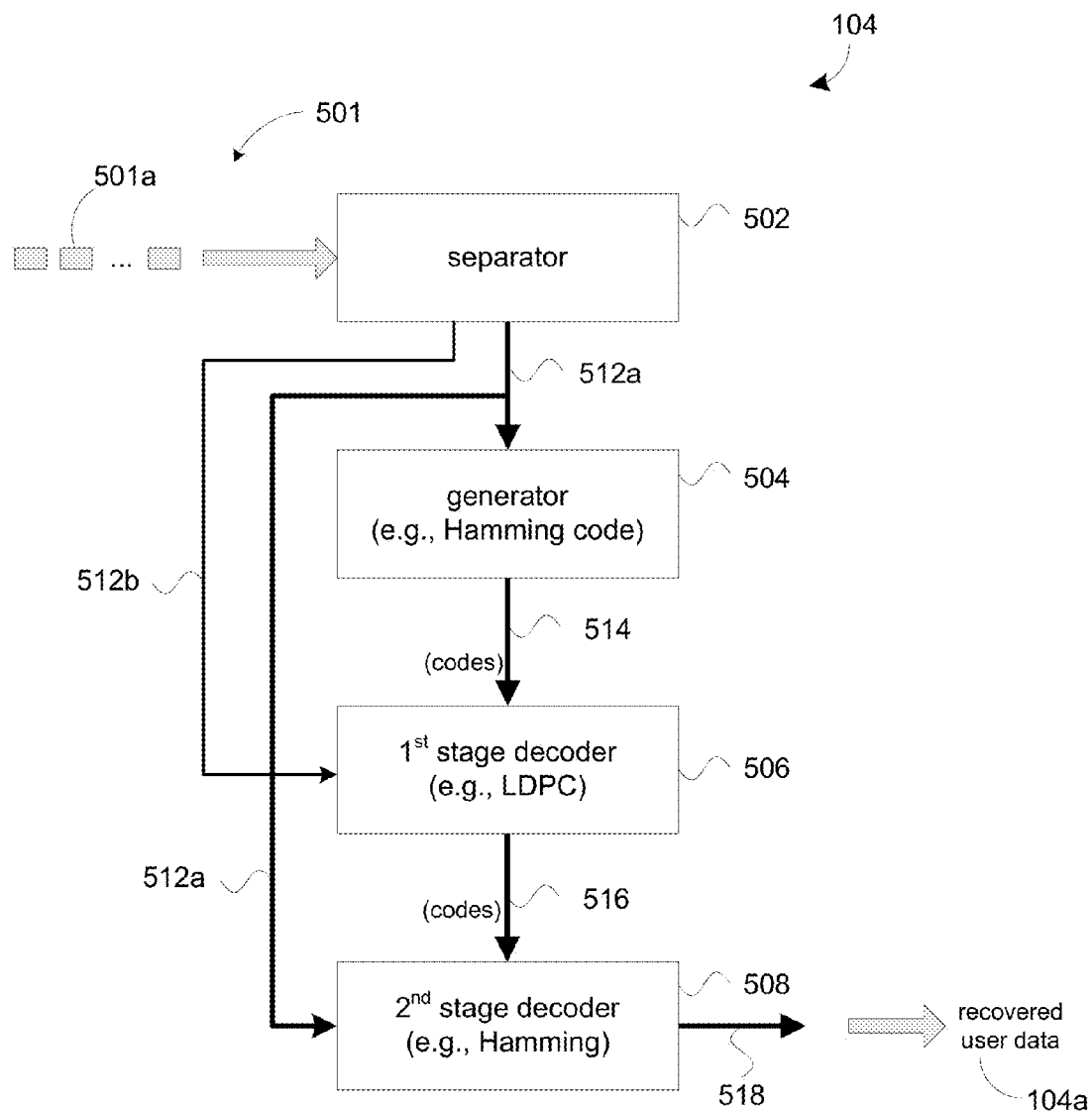
FIGS. 5, 5A, and 5B illustrate a decoder according to disclosed embodiments.

FIG. 5 represents a general structure of embodiments of the multi-stage decoder 104 in accordance with principles of the present invention. In some embodiments, the multi-stage decoder 104 includes a separator 502 that receives an incoming message stream 501. The message stream 501 may comprise a stream of messages 501a. For example, the incoming message stream 501 may be the message stream 102a produced by multi-stage encoder 102 and input to the multi-stage decoder 104 via detector 136. Each message 501a in the incoming message stream 501 may comprise a data portion and a code portion. For example, the message 102b in the message stream 102a shown in FIG. 3 comprises the data portion 301a and the outer code portion 214a. In some embodiments, the separator 502 extracts the constituent data portion and code portion from each incoming message 501a and outputs respective a stream of constituent data 512a and a stream of constituent codes 512b.

In some embodiments, the multi-stage decoder 104 includes a code generator 504. As explained above in FIG. 3, the inner codes 212a, 212b, and 212c, from which the outer code 214a is produced, are omitted from the transmitted message 102b. Thus, in accordance with principles of the present invention, the code generator 504 performs a code generation action to recover the inner codes 212a, 212b, and 212c from the stream of constituent data 512a. The code generator 504 receives the stream of constituent data 512a as its incoming data, and generates a code stream 514 of generated codes (e.g., parity codes) based on the incoming data. In an embodiment, for example, the first stage coder 202 may be a Hamming coder, in which case the code generator 504 produces Hamming codes. This aspect of the present invention will be discussed in more detail below.

A first stage decoder 506 receives the code stream 514 of generated codes and the stream of constituent codes 512b. The first stage decoder 506 treats the code stream 514 as the information bits and the stream of constituent codes 512b as codes, and combines the two streams to produce outer codewords. The first stage decoder 506 performs a decoding operation on the outer codewords to detect and/or correct errors in the code stream 514 (i.e., the information bits) to produce a recovered code stream 516. In an embodiment, for example, the second stage coder 204 may be an LDPC coder, in which case the first stage decoder 506 may be a corresponding LDPC decoder. Accordingly, the outer codewords produced in the first stage decoder 506 correspond to the outer codewords produced in the second stage coder 204.

A second stage decoder 508 may receive the recovered code stream 516 and the stream of constituent data 512a. The second stage decoder 508 may treat the stream of constituent data 512a as information bits and the recovered code stream 516 as codes, and combine the two streams to produce inner codewords. The second stage decoder 508 may then perform a decoding operation on the inner codewords to detect and/or correct errors in the stream of constituent data 512a (i.e., the information stream) to produce a recovered data stream 518. In an embodiment, for example, the first stage coder 202 may be a Hamming coder, in which case the second stage decoder 508 may a corresponding Hamming decoder. The recovered data stream 518 may be output by the multi-stage decoder 104 as the recovered user data 104a. Accordingly, the inner codewords produced in the second stage decoder 508 correspond to the inner codewords produced in the first stage coder 202.

Figure 6:
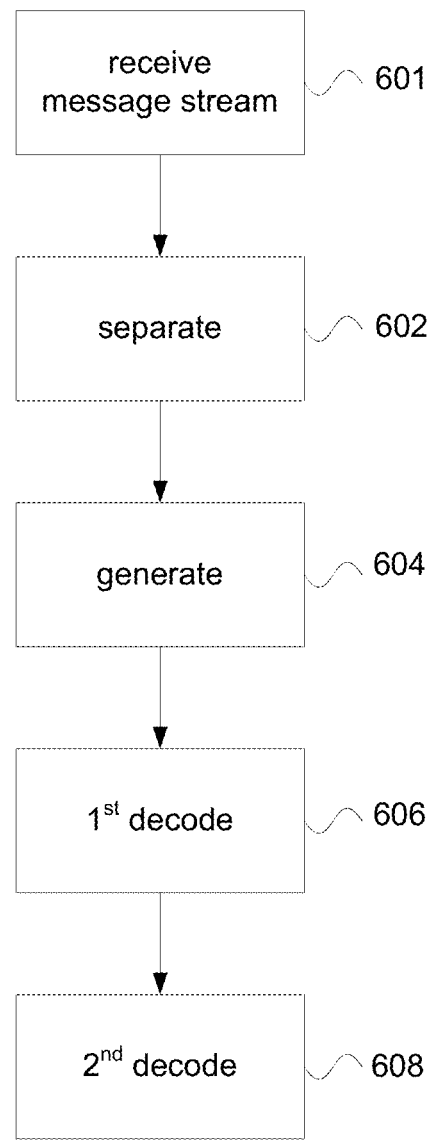
FIG. 6 is flow chart of an decoding process in accordance with disclosed embodiments.

Processing in the multi-stage decoder 104 shown in FIG. 5 will be explained in connection with the flow chart of FIG. 6 and the data diagram of FIG. 7. The data diagram in FIG. 7 represents the decoding of a received message 501a. At 601 the multi-stage decoder 104 receives the message stream 501 and process each message 501a in the message stream. At 602, the separator 502 generates a data portion 512a and a code portion 512b from the message 501a.

Recalling that the inner codes 212a, 212b, and 212c are omitted from the message 501a, at 604, the code generator 504 generates the omitted inner codes from the data portion 512a of the message 501a to produce generated codes 514a, 514b, 514c. In a particular embodiment, for example, the generated codes may be parity bits.

The code generator 504 may process hard decision data or soft decision data to produce the generated codes 514a, 514b, 514c. Suppose, for example, the inner code produced by the first stage coder 202 shown in FIG. 2 is a 5×4 TPC/SPC code:

| U00 | U01 | U01 | U03 | P0h |
| U10 | U11 | U12 | U13 | P1h |
| U20 | U21 | U22 | U23 | P2h |
| P0v | P1v | P2v | P3v | |

If hard decision detection is employed (e.g., a read operation from flash memory may generate hard decision data), each of the generated codes 514a, 514b, and 514c may be produced from the hard decision data in the message 501a using the following XOR ($\oplus$) operations:

$$P_{ih} = U_{i0} \oplus U_{i1} \oplus U_{i2} \oplus U_{i3}$$

$$P_{iv} = U_{0i} \oplus U_{1i} \oplus U_{2i} \oplus U_{3i},$$

where $U_{xy}$ represent hard decision information bits in the received message. If soft decision detection is employed, the message 501a will include soft decision data, and the generated codes 514a, 514b, and 514c may be computed using sum-product operations on the soft decision data:

$$LLR(P_{ih}) = 2\tanh^{-1}\left(\prod_{k=0}^{3} \tanh\left(\frac{LLR(U_{ik})}{2}\right)\right)$$

$$LLR(P_{iv}) = 2\tanh^{-1}\left(\prod_{k=0}^{3} \tanh\left(\frac{LLR(U_{ki})}{2}\right)\right),$$

where $LLR(U_{ik})$ and $LLR(U_{ki})$ represent the soft decision data. The sum-product operations may be approximated using min-sum operations, if simplification of the calculations is desired.

If the message 501a was received without error during transmission, then the bits of the data portion 512a would be the same as portion 301a from the multi-stage encoder 102, and the generated codes 514a, 514b, 514c generated by the decoder 104 would be the same as the inner codes 212a, 212b, 212c generated by the encoder 102. On the other hand, if the message 501a was corrupted during transmission, then the generated codes 514a, 514b, 514c may not match the inner codes 212a, 212b, 212c.

The first stage decoder 506 combines the generated codes 514a, 514b, 514c in the code stream 514 and the code portion 512b from the stream of constituent codes 512b into a codeword 702. At 606, the first stage decoder 506 may treat the generated codes 514a, 514b, 514c as information bits in the codeword 702, and the code portion 512b as the code portion of the codeword. In a given embodiment, the first stage decoder 506 implements an LDPC decoder if the corresponding second stage coder 204 shown in FIG. 2 implements an LDPC coder. A result of this step may be the detection and/or correction of errors in the generated codes 514a, 514b, 514c. The resulting recovered codes 516a, 516b, 516c may then be used to decode the data portion 512a.

The second stage decoder 508 receives the recovered codes 516a, 516b, 516c from recovered code stream 516 and the data portion 512a from the stream of constituent data 512a. At 608, the second stage decoder 508 makes a pairing between data segments 512a-1, 512a-2, 512a-3 and corresponding recovered codes 516a, 516b, 516c, to form respective codewords 704a, 704b, 704c. In a given embodiment, the second stage decoder 508 implements a Hamming decoder if the corresponding first stage coder 202 implements a Hamming coder. A result of this step may be the detection and/or correction of errors in the data segments 512a-1, 512a-2, 512a-3. The resulting recovered data $U'_x \ldots U'_{x+11}$ constitute a portion 518' of the recovered data stream 518 shown in FIG. 5.

Figure 5A:
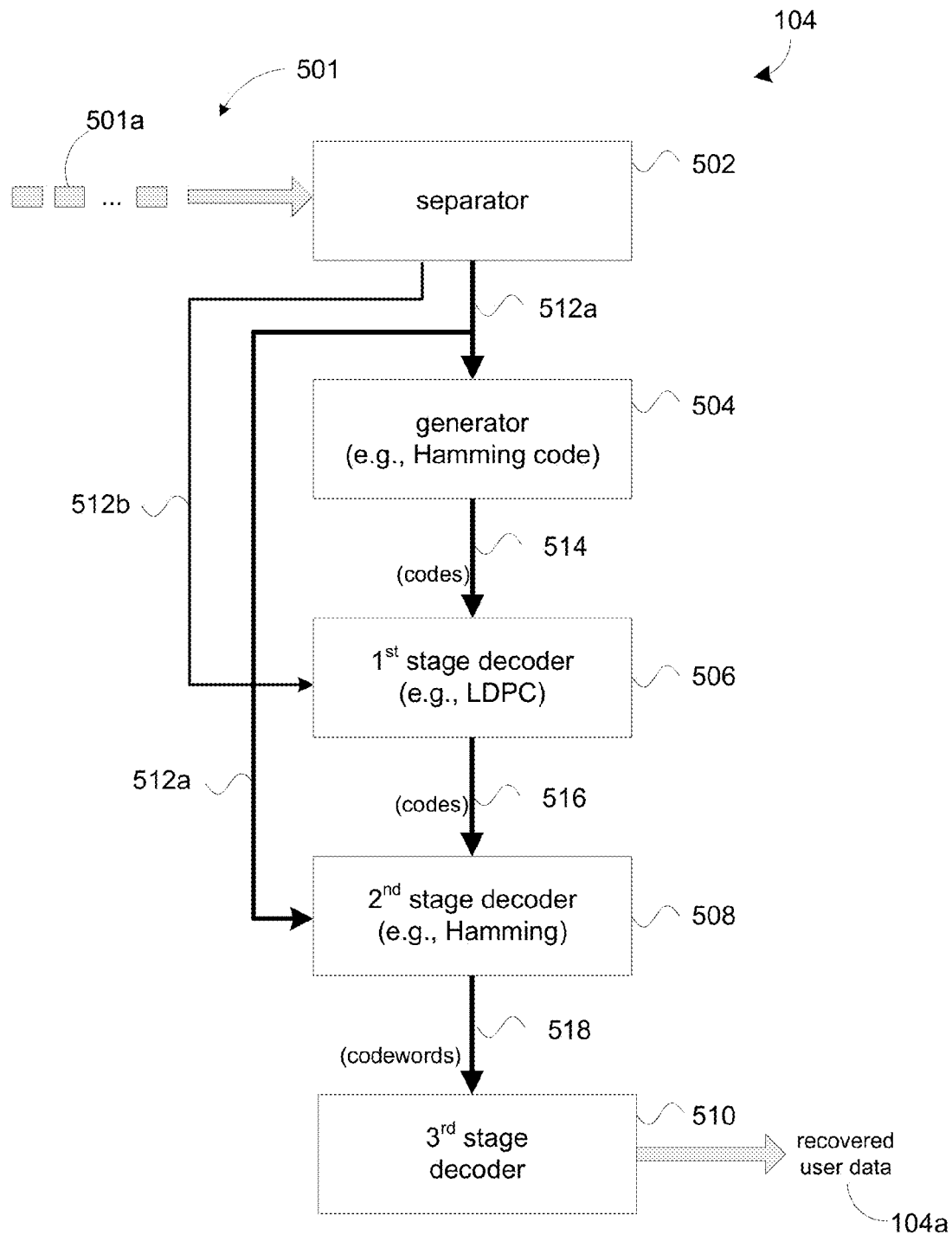

As noted in FIG. 2A, embodiments of multi-stage encoder 102 may include a $1^{st}$ stage encoding of the incoming user data stream 101. For example, FIG. 2A shows that the first stage encoder 208 may be a BCH encoder, or an RS encoder, and so on. The stream of constituent data 512a may therefore comprise codewords produced by the first stage encoder 208. Accordingly, embodiments of the multi-stage decoder 104 may include a corresponding inverse operation. FIG. 5A, for example, illustrates that embodiments of multi-stage decoder 104 may include a third stage decoder 510 that receives codewords in the recovered data stream 518. For example, if the first stage encoder 208 implemented a BCH coder, then the third stage decoder 510 may implement a BCH decoder.

Figure 5B:
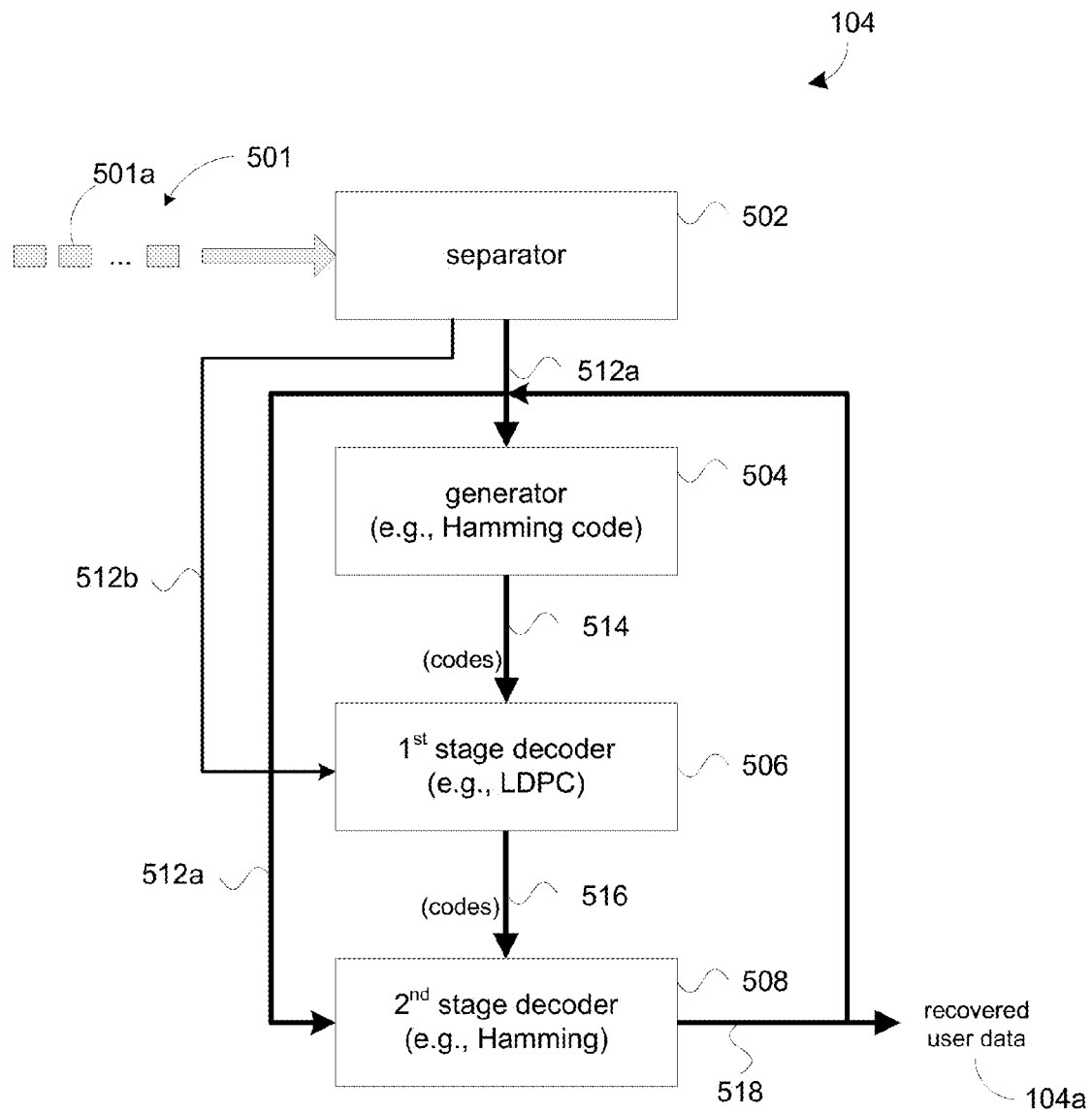

In some embodiments, the multi-stage decoder 104 may operate in an iterative mode as illustrated in FIG. 5B, for example. Accordingly, the recovered data stream 518 produced by the second stage decoder 508 is fed back to the code generator 504 as incoming data into the encoder. Processing through the code generator 504 and the decoders 506 and 508 would proceed along the lines discussed above. Referring to FIG. 7, for example, the portion 518' of the recovered data stream 518 may be processed as the data portion 512a. In some embodiments, multiple s iterations may be performed.

Figure 3A:
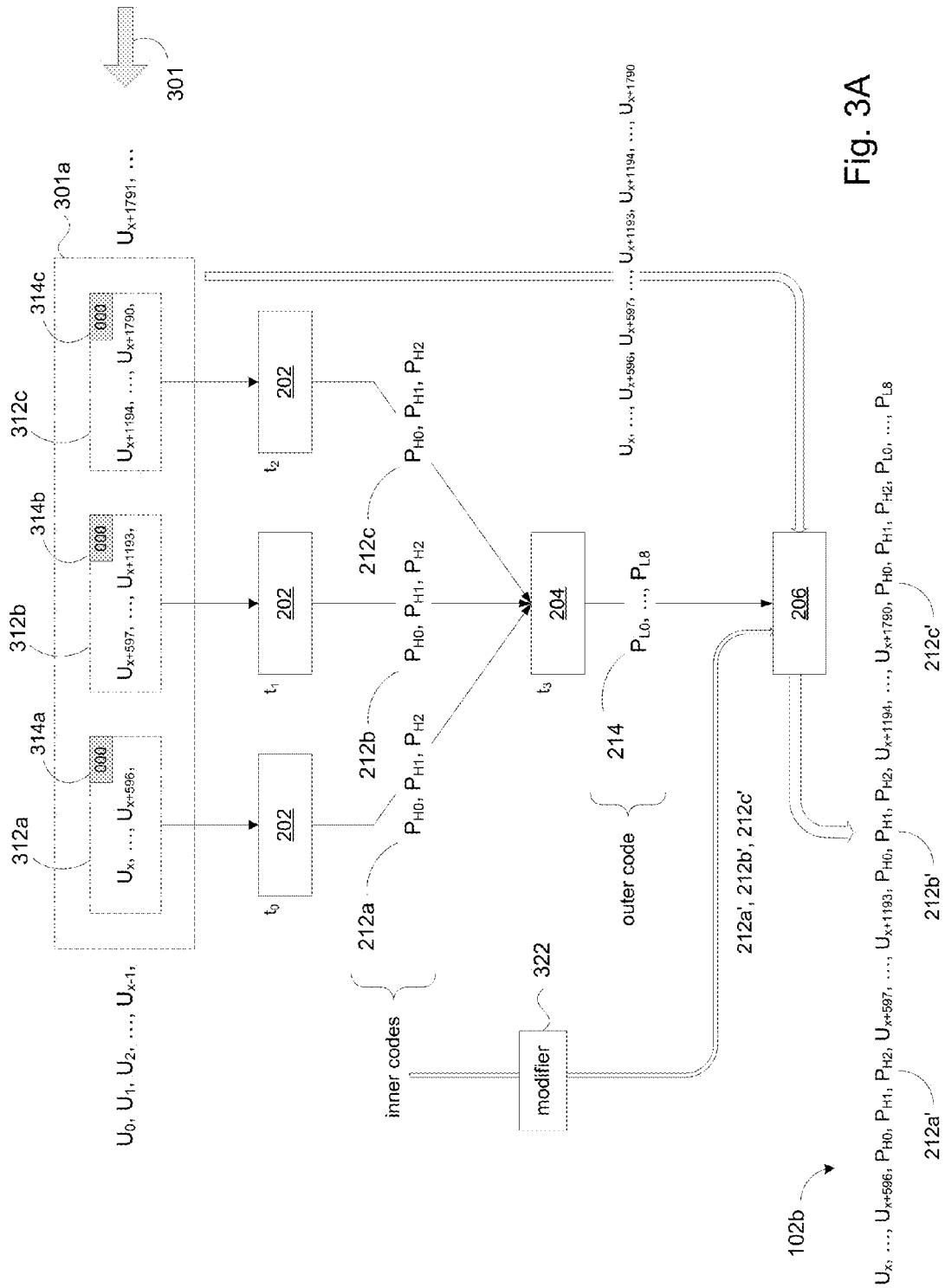

In some embodiments, the multi-stage encoder 102 may incorporate the inner codes (e.g., 212a, 212b, 212c in FIG. 3) in the respective data segments 302a, 302b, 302c that were used to generate the inner codes in a process that may be referred to as "parity hiding." Referring to FIG. 3A, reserve bits 314a, 314b, and 314c may be reserved in respective data segments 312a, 312b, and 312c to embed the inner codes 212a, 212b, and 212c. For example, suppose a data segment is 600 bits in length and the inner code is 3 bits. A data segment 312a may comprise 597 bits from the incoming data stream and 3 reserve bits 314a for the inner code; the 3 reserve bits may be initially set to bit zero, for example. Encoding may then be performed on the data segments 312a, 312b, and 312c (597 data stream bits+3 zero bits) to produce corresponding 3-bit inner codes 212a, 212b, and 212c. The inner codes 212a, 212b, and 212c are processed as explained above to produce the outer code (e.g., 214a).

The inner codes 212a, 212b, and 212c may then be embedded (parity hiding) into the reserve bits 314a, 314b, 314c of the respective data segments 312a, 312b, and 312c. The inner codes 212a, 212b, and 212c feed into a modifier 322 to produce modified inner codes 212a', 212b', and 212c'. The modified inner codes 212a', 212b', and 212c' are then copied into the reserve bits 314a, 314b, 314c of the respective data segments 312a, 312b, and 312c. The outer code 214a is then be combined with the data segments 312a, 312b, and 312c, to produce message 102b which is transmitted via channel 134.

The modifier 322 modifies an inner code, e.g. 212a, to generate a modified inner code 212a' such that when the modified inner code is embedded in its corresponding data segment 312a and then processed by the first stage coder 202, the resulting inner code is equal to the original un-modified inner code 212a. This may be summarized by the following expressions:

FirstStageCoder(312a) ⇒ 212a

Modifier(212a) ⇒ 212a'

FirstStageCoder(312a+212a') ⇒ 212a, where "312a+212a'" represents modified inner code 212a' embedded into data segment 312a.

Figure 7A:
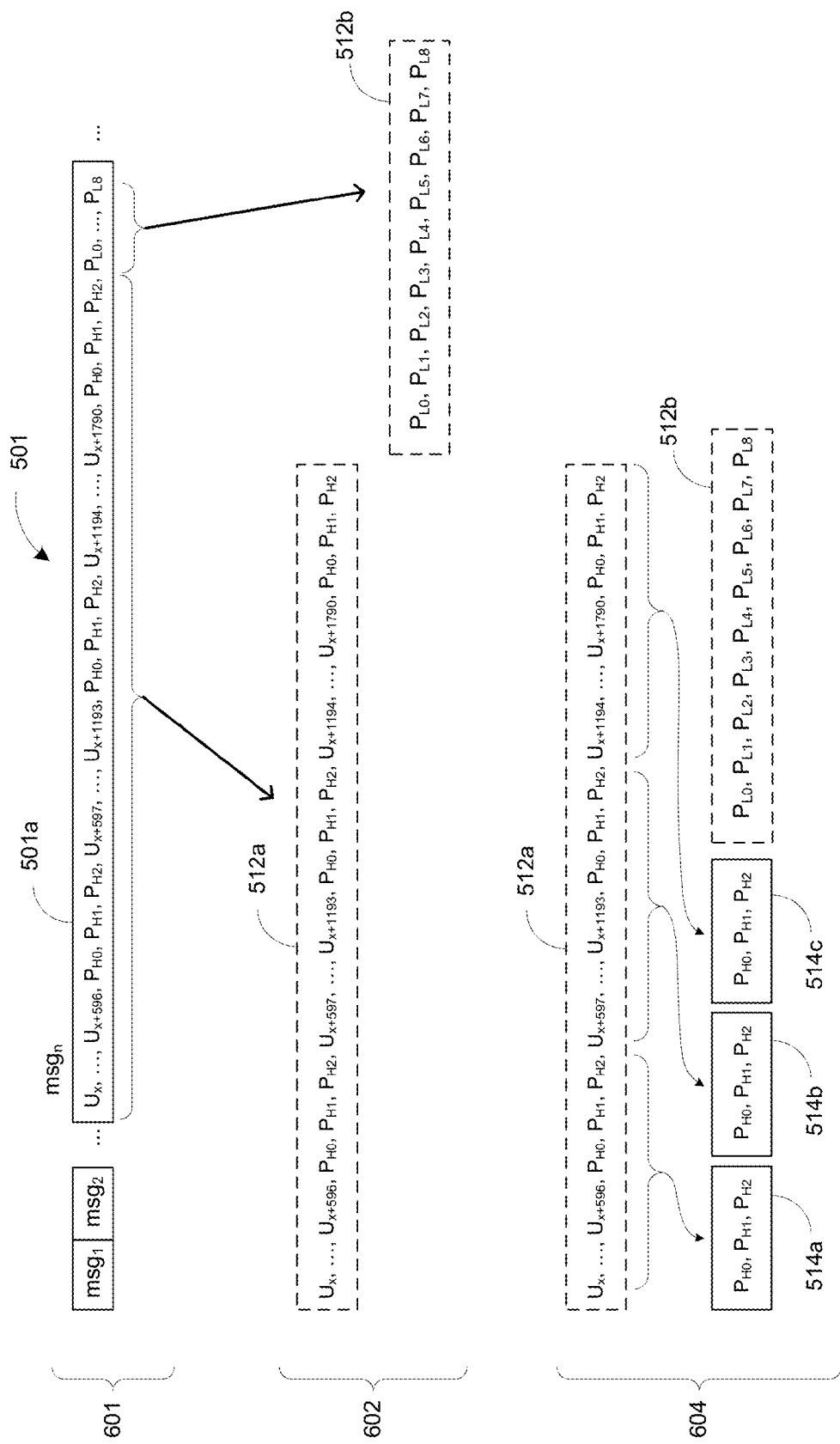

Referring to FIG. 7A, at the multi-stage decoder 104, the received message 501a includes the embedded inner codes 212a', 212b', and 212c'. Processing in the multi-stage decoder 104 can proceed as discussed above in connection with FIG. 7, beginning with operation 604.

Figure 3B:
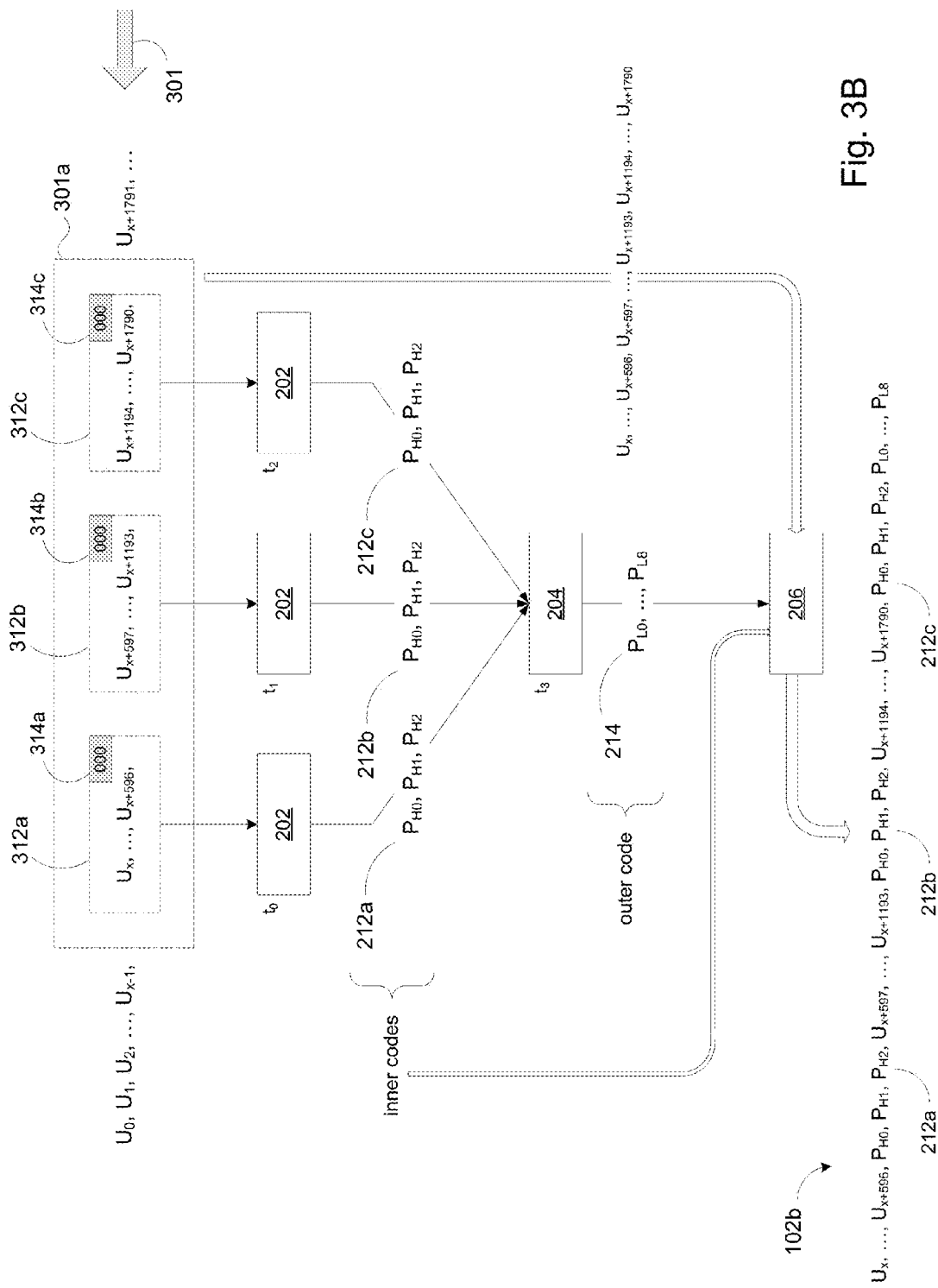

Referring to FIG. 3B, parity hiding in accordance with other embodiments may omit the modifier 322. The inner codes 212a, 212b, and 212c may be generated as explained above and subsequently processed to produce the outer code (e.g., 214a). The inner codes 212a, 212b, and 212c may then be embedded into the data segments 312a, 312b, and 312c by copying them directly into the respective reserve bits 314a, 314b, 314c. The outer code 214a is then be combined with the data segments 312a, 312b, and 312c, to produce message 102b which is transmitted via channel 134.

Figure 7B:
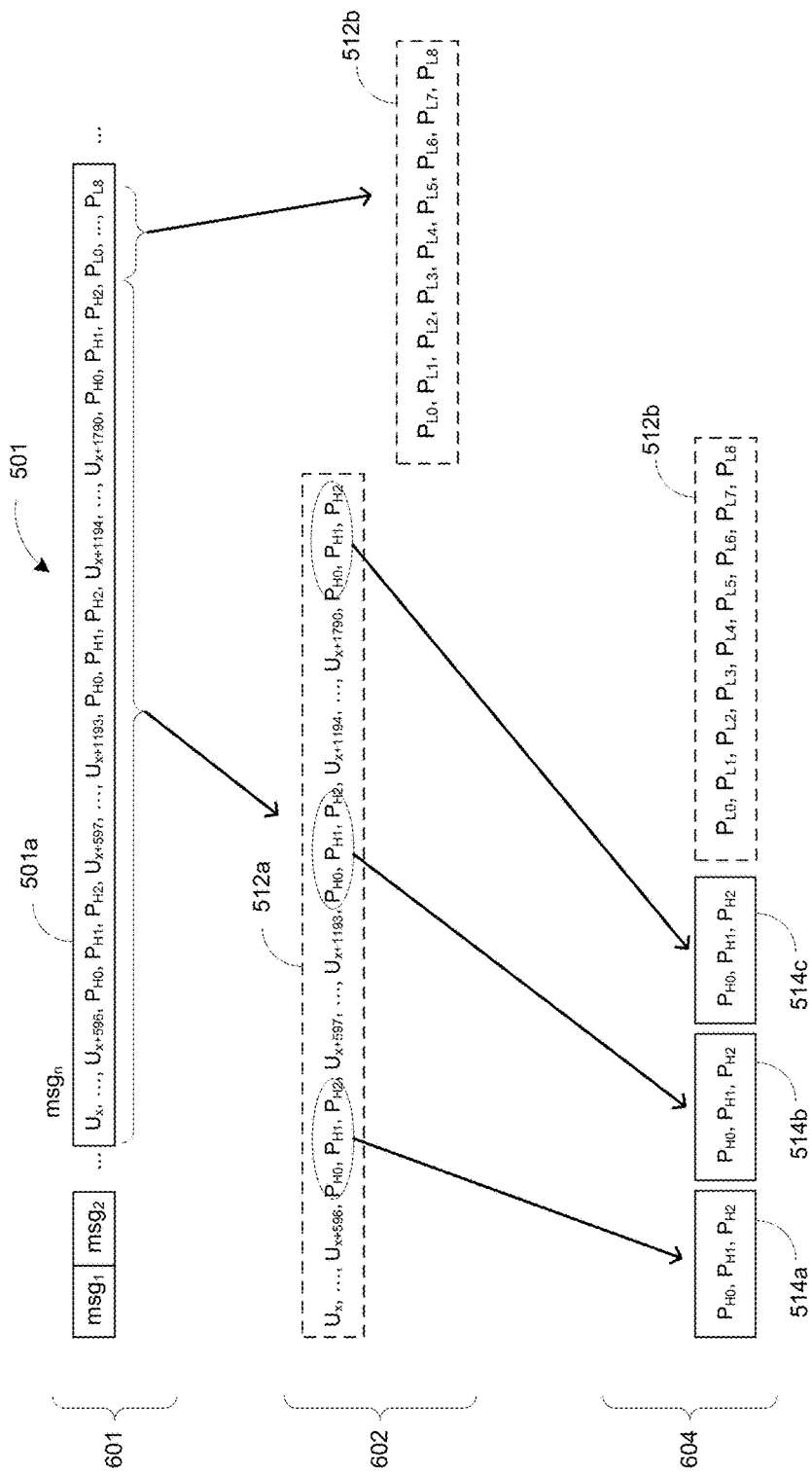

Referring to FIG. 7B, at the multi-stage decoder 104, the generating operation 604 may comprise copying out the embedded inner codes from the received message 501a to produce the generated codes 514a, 514b, and 514c. Processing in the decoder 104 may continue with operation 606 as explained above in connection with FIG. 7.

With parity hiding, the embedded the inner codes 212a', 212b', and 212c' are subject to the same channel errors as the rest of the transmitted message 102b. Accordingly, errors in the generated codes 514a, 514b, and 514c have the same characteristics as the rest of the received message 501a. This can increase the stability of error detection and/or error correction processing.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents will be evident to those skilled in the art and may be employed without departing from the spirit and scope of the invention as defined by the claims.

What is claimed is:

1. A method comprising:
   receiving a message comprising a data part and a code part;
   generating a generated code based on the data part of the message;
   decoding a combination of the generated code and the code part of the message to produce a recovered code; and
   producing recovered data from the message including decoding the data part of the message using the recovered code.

2. The method of claim 1 wherein producing recovered data from the message comprises decoding the data part of the message with the recovered code to produce a decoded data part, and decoding the decoded data part to produce the recovered data.

3. The method of claim 1 further comprising repeating the generating, decoding, and producing.

4. The method of claim 1 wherein the message is produced by:
   receiving incoming data;
   encoding a first segment of the incoming data to produce a first code;
   encoding at least the first code to produce a second code; and
   combining at least the first segment of the incoming data with the second code to produce an outgoing message,
   wherein the message is a received form of the outgoing message.

5. The method of claim 4 further comprising combining the first code with the first segment of the incoming data.

6. The method of claim 5 wherein the combining includes modifying the first code to produce a modified first code and combining the modified first code with the first segment of the incoming data.

7. The method of claim 1 wherein the message includes soft decision data, wherein the generating includes computing the generated code using the soft decision data.

8. The method of claim 1 further comprising performing the receiving, generating, decoding, and producing in a flash memory device.

9. The method of claim 1, further comprising separating the data part and the code part from the message.

10. The method of claim 1, wherein generating the generated code is performed in a decoder.

11. A system comprising:
   a separator configured to receive a message stream comprising a plurality of messages, each message comprising a data part and a code part, the separator outputting the data part and the code part;
   a generator configured to receive the data part from the separator, the generator configured to output a generated code based on the data part;
   a first decoder configured to receive the generated code from the generator and the code part from the separator, the first decoder configured to output a recovered code based on the generated code and the code part; and
   a second decoder configured to receive the recovered code from the first decoder and the data part from the separator, the second decoder configured to output recovered data based on the data part and the recovered code.

12. The system of claim 11 wherein the first decoder decodes a codeword comprising the generated code and the code part of the message.

13. The system of claim 12 wherein the second decoder decodes a codeword comprising the data part of the message and the recovered code.

14. The system of claim 11 wherein the generator is further configured to receive the output of the second decoder to output a second generated code based on the output received from the second decoder.

15. The system of claim 11 wherein the first decoder is a Low Density Parity Check (LDPC) decoder.

16. The system of claim 11 wherein the second decoder is a Hamming decoder, a Turbo-Decoder Coprocessor (TCP)/Single Parity Check (SPC) decoder, or a Bose-Chaudhuri-Hocquenghem (BCH) decoder.

17. The system of claim 11, wherein the generator is in a decoder.

18. A semiconductor memory comprising:
   a multi-stage encoder having an input to receive input data and having an output to output encoded data, the multi-stage encoder comprising:
      a first coder configured to receive the input data and to produce first codes using the data;
      a second coder configured to receive the first codes and to produce second codes using the first codes; and
      a combiner configured to combine the input data and the second codes to produce the encoded data;
   a memory for receiving the encoded data for storage therein; and
   a multi-stage decoder having an input to receive the encoded data from the memory and having an output to output recovered data, the multi-stage decoder comprising:
      a generator configured to receive the encoded data and to produce third codes;
      a first decoder configured to receive the second codes in the encoded data and the third codes and to produce recovered codes using the second codes and the third codes; and
      a second decoder configured to receive the input data in the encoded data and the recovered codes and to produce recovered data using the input data and the recovered codes.

19. The semiconductor memory of claim 18 wherein the first decoder performs an inverse operation of the second coder, wherein the second decoder performs an inverse operation of the first coder.

20. The semiconductor memory of claim 18 wherein the first coder is a Hamming coder and the second decoder is a Hamming decoder.

21. The semiconductor memory of claim 18 wherein the first coder is a Single Parity Check (SPC)/Turbo-Decoder Coprocessor (TPC) coder and the second decoder is a SPC/TPC decoder.

22. The semiconductor memory of claim 18 wherein the encoded data received from the memory includes soft decision data, wherein the generator is further configured to produce the third codes using the soft decision data.

23. The semiconductor memory of claim 18 wherein the memory is flash memory.

24. The semiconductor memory of claim 18, further comprising a separator configured to separate the input data from the second codes in the encoded data.

* * * * *